(12) United States Patent
Baars et al.

(10) Patent No.: US 8,927,407 B2
(45) Date of Patent: Jan. 6, 2015

(54) METHOD OF FORMING SELF-ALIGNED CONTACTS FOR A SEMICONDUCTOR DEVICE

(75) Inventors: Peter Baars, Dresden (DE); Andy Wei, Dresden (DE); Erik Geiss, Saratoga Springs, NY (US); Martin Mazur, Pulsnitz (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 79 days.

(21) Appl. No.: 13/354,739

(22) Filed: Jan. 20, 2012

(65) Prior Publication Data

US 2013/0189833 A1 Jul. 25, 2013

(51) Int. Cl.
  *H01L 21/28* (2006.01)
(52) U.S. Cl.
  USPC .............. 438/586; 257/288; 257/E29.255; 257/E21.409; 257/E21.19
(58) Field of Classification Search
  USPC ............. 257/288, E29.255, E21.409, E21.19; 438/586, 622
  See application file for complete search history.

(56) References Cited

U.S. PATENT DOCUMENTS

| | | |
|---|---|---|
| 4,440,804 A | 4/1984 | Milgram |
| 4,466,172 A | 8/1984 | Batra |
| 4,517,729 A | 5/1985 | Batra |
| 5,106,783 A | 4/1992 | Chin et al. |
| 5,266,523 A | 11/1993 | Manning |
| 5,665,623 A | 9/1997 | Liang et al. |
| 6,025,255 A | 2/2000 | Chen et al. |
| 6,096,644 A | 8/2000 | Lukanc |
| 6,165,880 A | 12/2000 | Yaung et al. |
| 6,258,714 B1 | 7/2001 | Shrivastava |
| 6,265,296 B1 | 7/2001 | Yen et al. |
| 6,268,281 B1 | 7/2001 | Shih et al. |
| 6,291,860 B1 | 9/2001 | Lukanc |
| 6,329,252 B1 | 12/2001 | Lin |
| 6,348,379 B1 | 2/2002 | Wang et al. |
| 6,359,307 B1 | 3/2002 | Wang et al. |
| 6,509,229 B1 | 1/2003 | Wang et al. |
| 6,521,540 B1 | 2/2003 | Li |
| 6,607,955 B2 | 8/2003 | Lee |
| 6,885,052 B2 | 4/2005 | Ahn et al. |
| 6,939,768 B2 | 9/2005 | Jeng |
| 7,098,114 B1 | 8/2006 | Syau et al. |
| 7,126,198 B2 | 10/2006 | Steiner et al. |
| 7,132,708 B2 | 11/2006 | Ahn et al. |
| 7,332,775 B2 | 2/2008 | Steiner et al. |
| 7,382,054 B2 | 6/2008 | Luoh et al. |
| 7,563,701 B2 | 7/2009 | Chang et al. |
| 7,575,990 B2 | 8/2009 | Wei |

(Continued)

*Primary Examiner* — Fernando L Toledo
*Assistant Examiner* — Lawrence-Linh T Nguyen
(74) *Attorney, Agent, or Firm* — Amerson Law Firm, PLLC

(57) ABSTRACT

Disclosed herein is a method of forming self-aligned contacts for a semiconductor device. In one example, the method includes forming a plurality of spaced-apart sacrificial gate electrodes above a semiconducting substrate, wherein each of the gate electrodes has a gate cap layer positioned on the gate electrode, and performing at least one etching process to define a self-aligned contact opening between the plurality of spaced-apart sacrificial gate electrodes. The method further includes removing the gate cap layers to thereby expose an upper surface of each of the sacrificial gate electrodes, depositing at least one layer of conductive material in said self-aligned contact opening and removing portions of the at least one layer of conductive material that are positioned outside of the self-aligned contact opening to thereby define at least a portion of a self-aligned contact positioned in the self-aligned contact opening.

19 Claims, 9 Drawing Sheets

(56) References Cited

U.S. PATENT DOCUMENTS

| | | |
|---|---|---|
| 7,582,567 B1 | 9/2009 | Syau et al. |
| 7,888,804 B2 | 2/2011 | Luoh et al. |
| 2006/0223302 A1* | 10/2006 | Chang et al. ............... 438/622 |
| 2007/0241411 A1 | 10/2007 | Yang et al. |
| 2010/0038715 A1 | 2/2010 | Babich et al. |
| 2010/0078690 A1* | 4/2010 | Sugiyama et al. ............ 257/288 |
| 2010/0155743 A1 | 6/2010 | Treu et al. |
| 2011/0108930 A1* | 5/2011 | Cheng et al. ................. 257/412 |
| 2011/0156107 A1 | 6/2011 | Bohr et al. |

\* cited by examiner

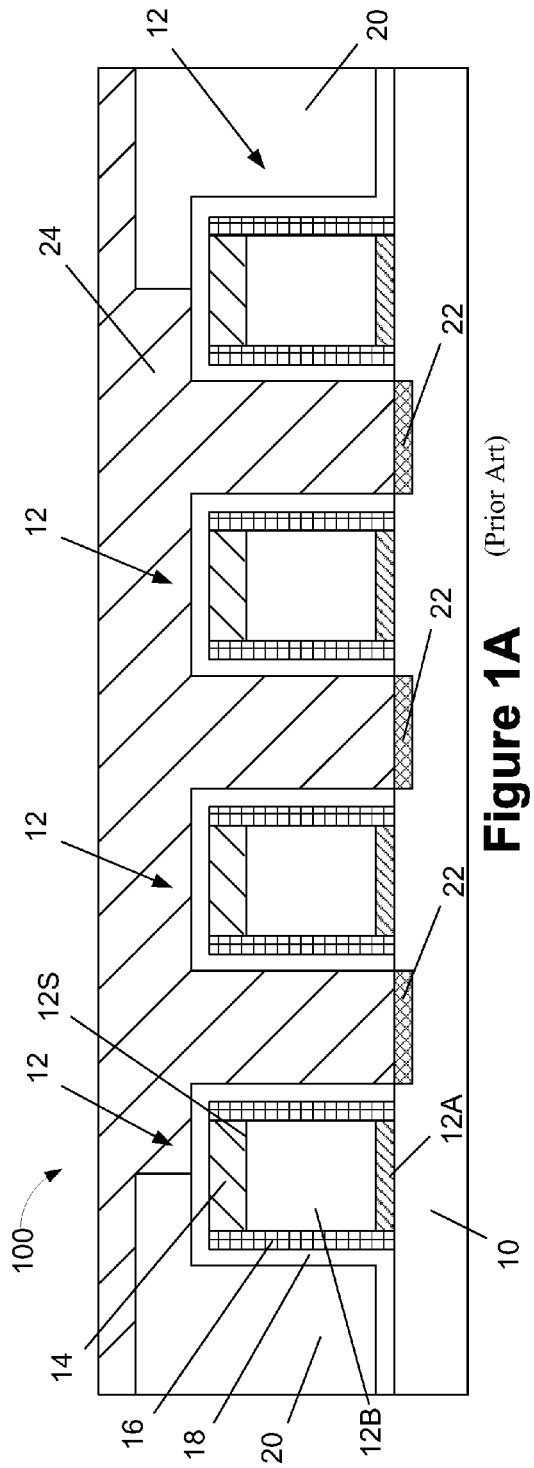
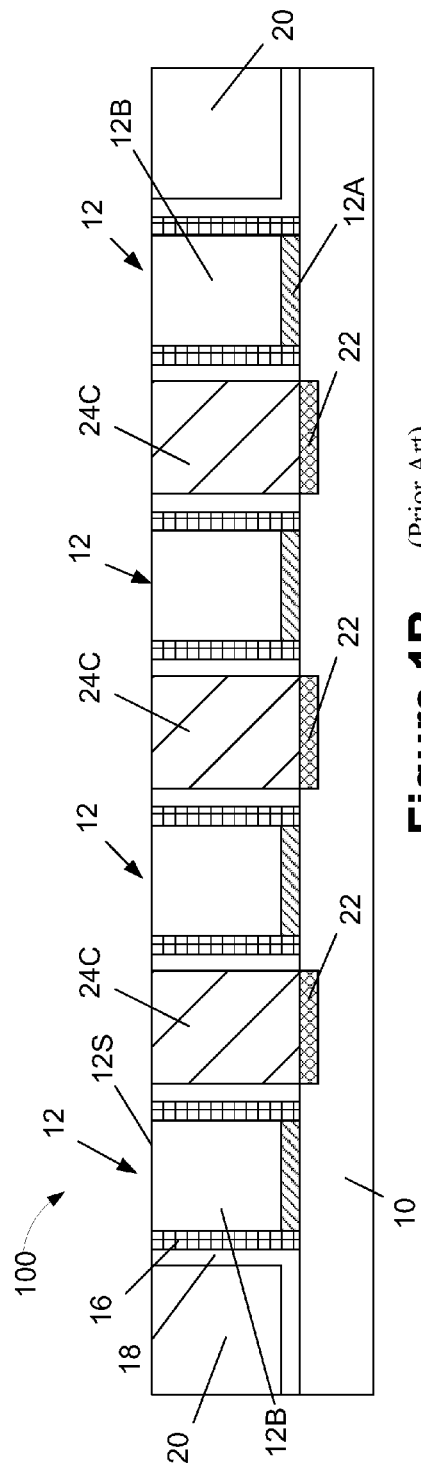

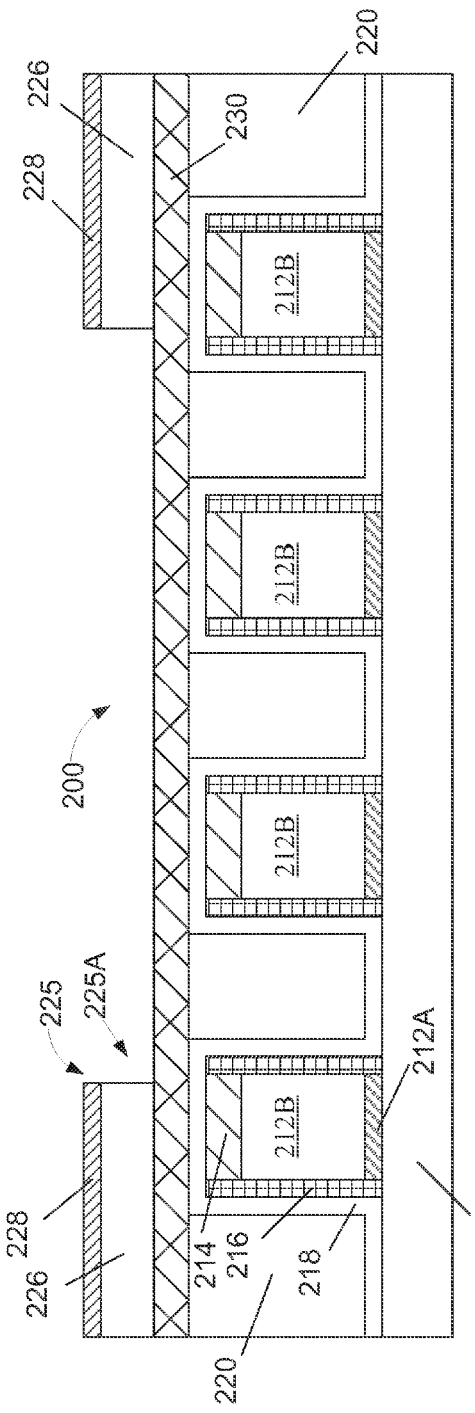
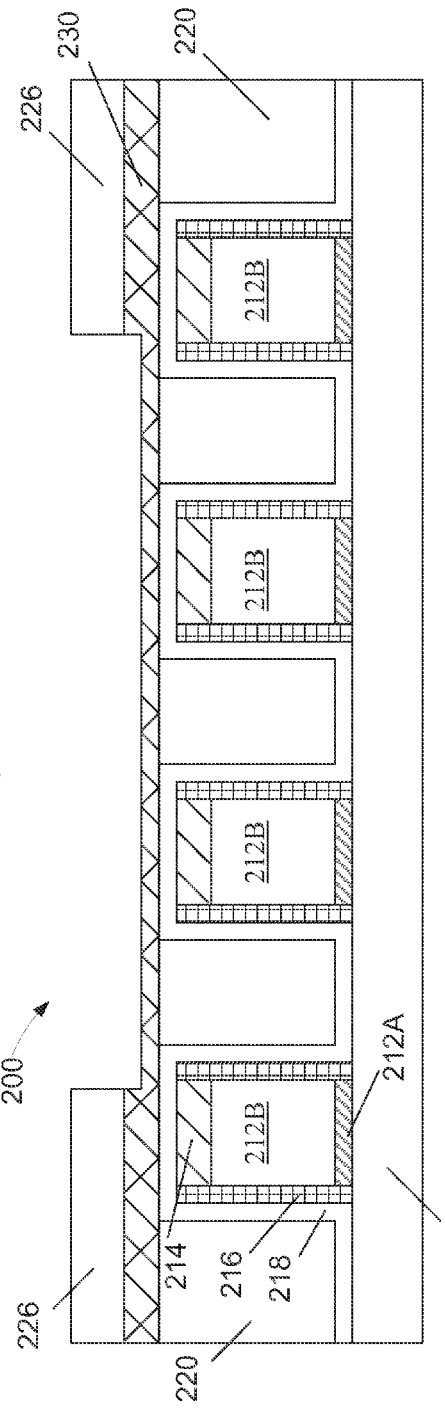
Figure 2C
Figure 2D

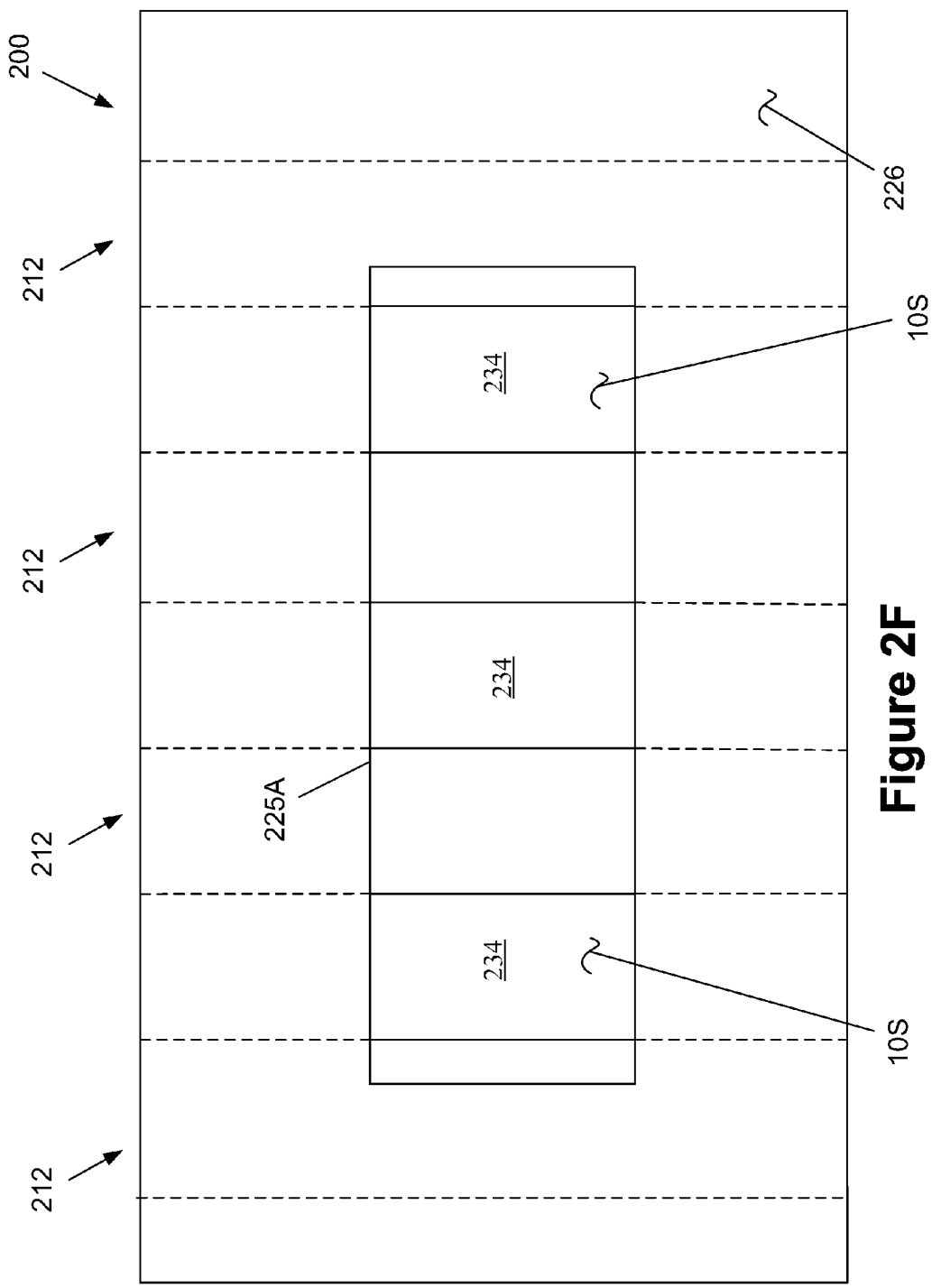

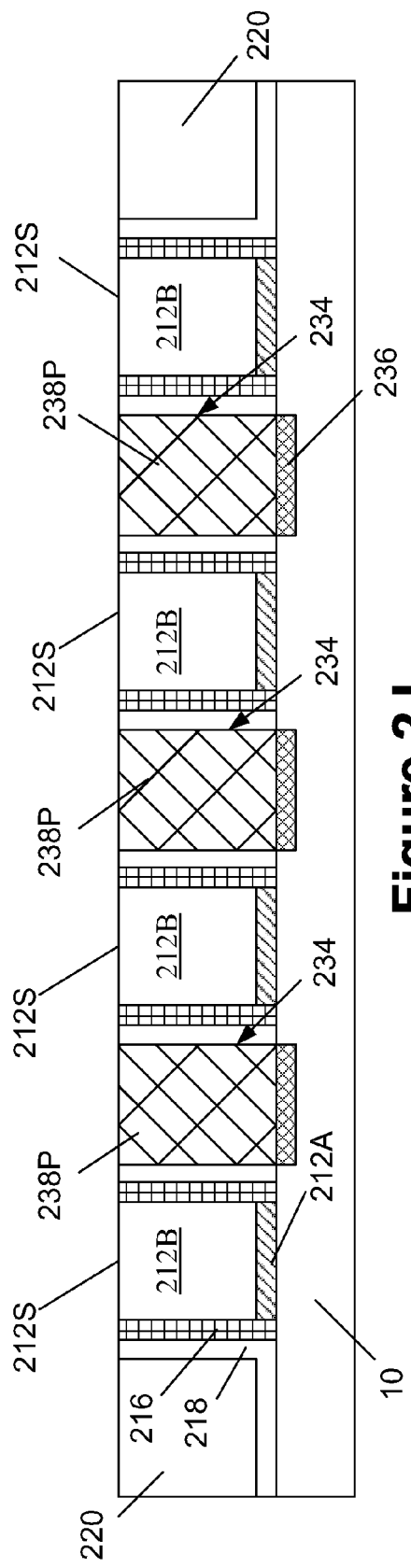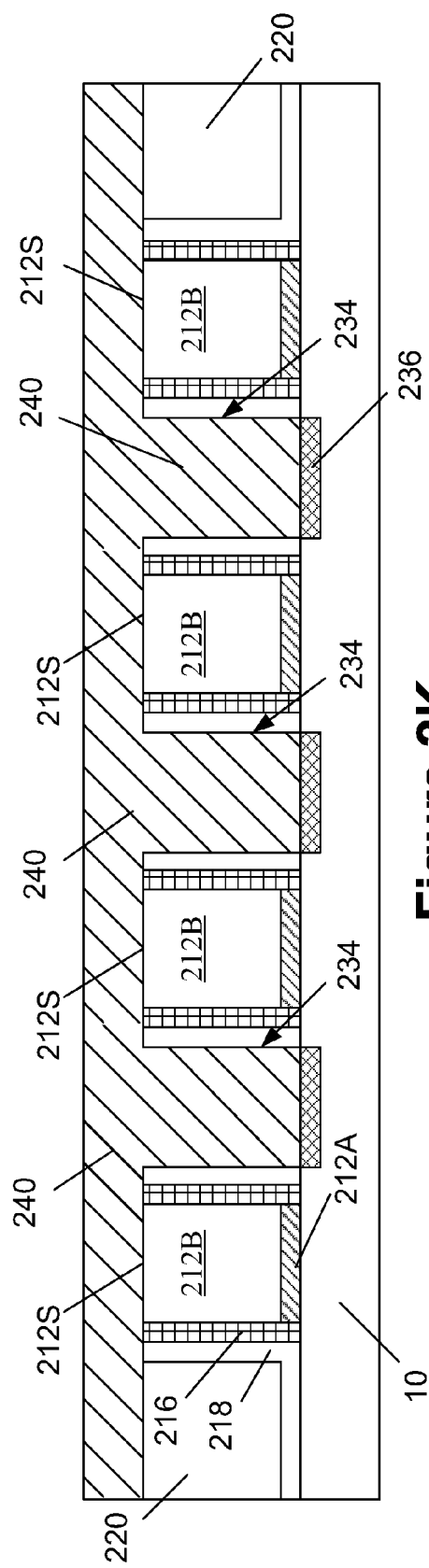

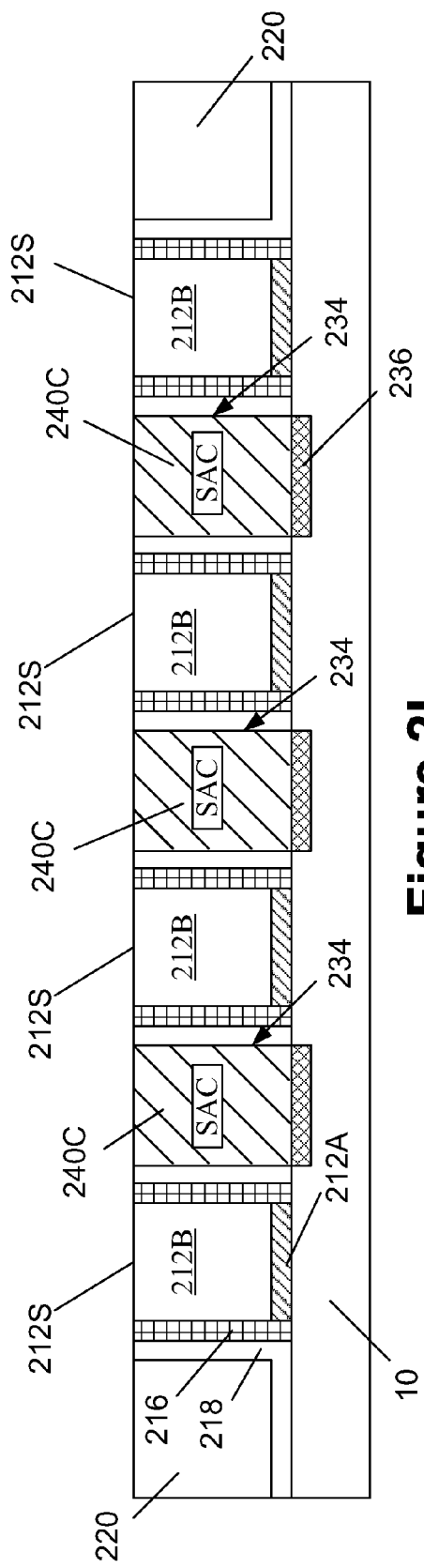
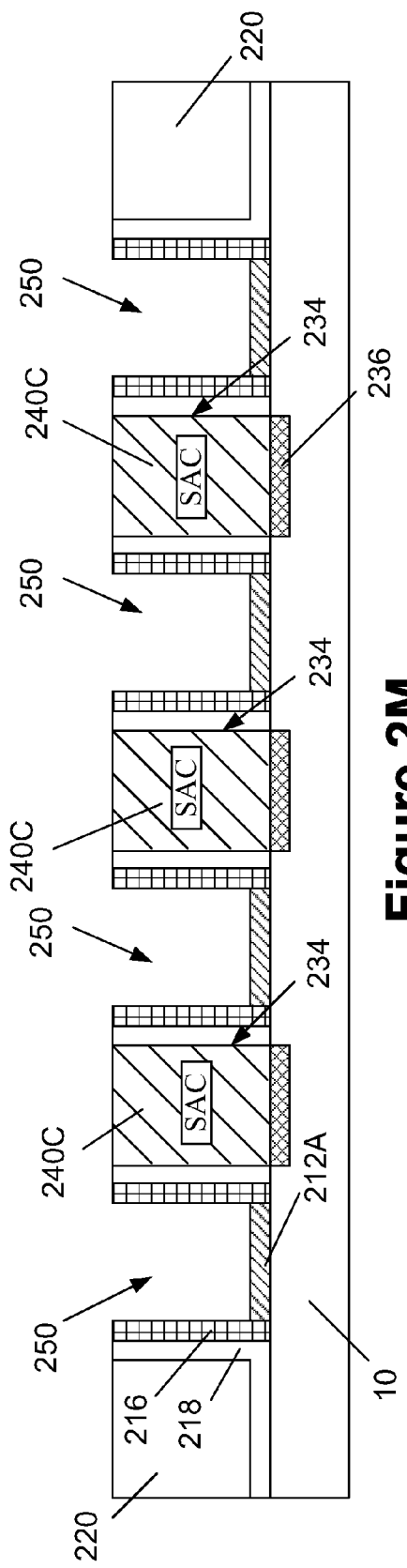
Figure 2L
Figure 2M

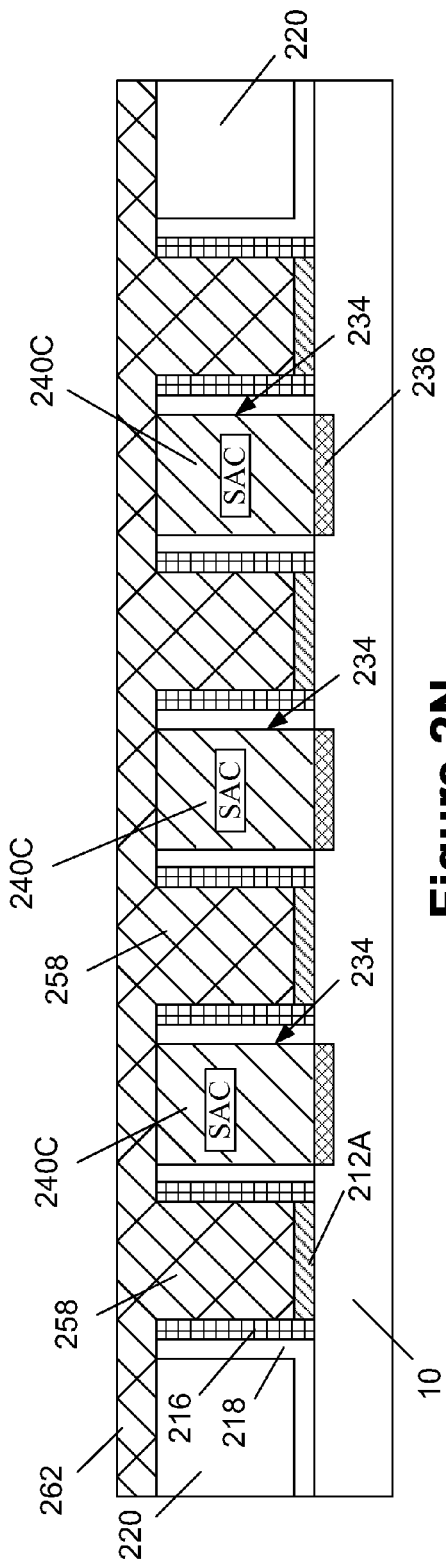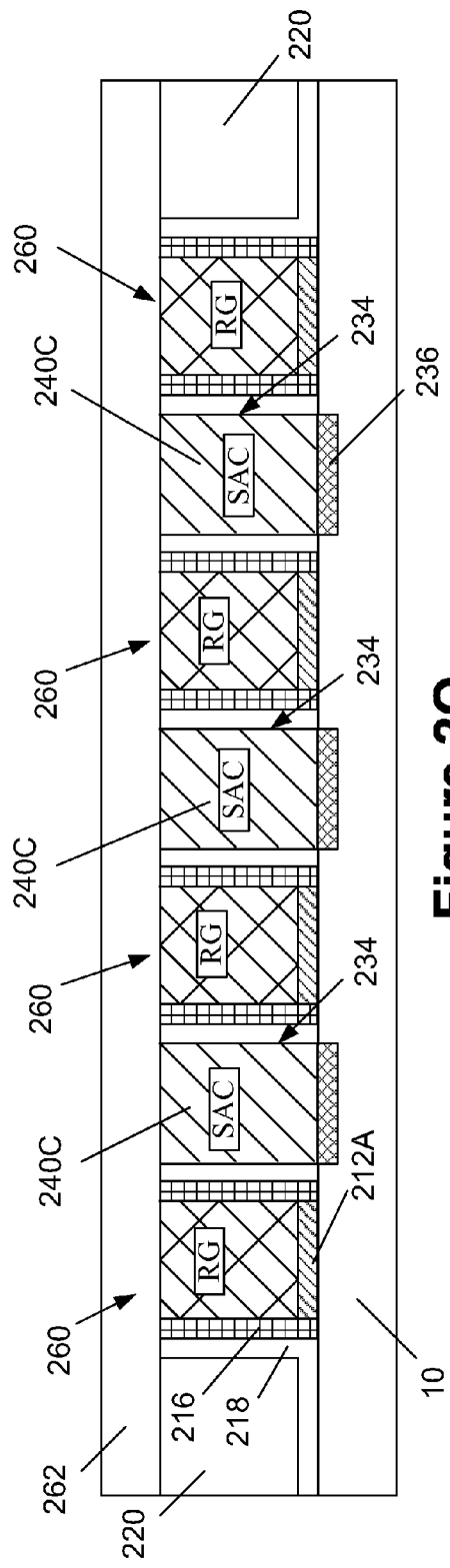
Figure 2N
Figure 2O

US 8,927,407 B2

METHOD OF FORMING SELF-ALIGNED CONTACTS FOR A SEMICONDUCTOR DEVICE

BACKGROUND OF THE INVENTION

1. Field of the Invention

Generally, the present disclosure generally relates to the manufacturing of sophisticated semiconductor devices, and, more specifically, to methods of forming self-aligned contacts on a semiconductor device.

2. Description of the Related Art

The fabrication of advanced integrated circuits, such as CPUs, storage devices, ASICs (application specific integrated circuits) and the like, requires a large number of circuit elements to be formed on a given chip area according to a specified circuit layout, wherein field effect transistors represent one important type of circuit element that substantially determines performance of the integrated circuits. In modern integrated circuits, such as microprocessors, storage devices and the like, a very high number of circuit elements, especially transistors, are provided and operated on a restricted chip area. Although immense progress has been made over recent decades with respect to increased performance and reduced feature sizes of the circuit elements, there is an constant demand for enhanced functionality of electronic devices which forces semiconductor manufacturers to steadily reduce the dimensions of the circuit elements and to increase the operating speed thereof. The continuing scaling of feature sizes, however, involves great efforts in redesigning process techniques and developing new process strategies and tools so as to comply with new design rules.

However, with some modern devices, operating speed of complex integrated circuits is no longer limited by the switching speed of the individual transistor element, but rather by the electrical performance of the complex wiring system used in such an integrated circuit. Such a wiring system may be formed above the device level and it may include the actual semiconductor-based circuit elements, such as transistors and the like. Typically, due to the large number of circuit elements and the required complex layout of modern integrated circuits, the electrical connections of the individual circuit elements cannot be established within the same device level, on which the circuit elements are manufactured, but require one or more additional metallization layers, which generally include metal-containing lines providing the inner level electrical connection, and also include a plurality of inter-level connections or vertical connections, which are also referred to as vias. These interconnect structures can be made of a variety of different materials, e.g., copper, and they provide the electrical connection of the various stacked metallization layers.

Furthermore, in order to actually connect the circuit elements formed in the semiconductor material with the metallization layers, an appropriate vertical contact structure is provided, which connects, on one end, to a respective contact region of a circuit element, such as a gate electrode and/or the drain and source regions of transistors. The opposite end of the vertical contact is conductively coupled to a respective metal line in the metallization layer and/or to a contact region of a further semiconductor based circuit element, in which case the interconnect structure in the contact level is also referred to as local interconnect. The contact structure may comprise contact elements or contact plugs having a generally square or round shape that are formed in an interlayer dielectric material, which in turn encloses and passivates the circuit elements. Upon further shrinkage of the critical dimensions of the circuit elements in the device level, the dimensions of metal lines, vias and contact elements also have to be adapted to the reduced dimensions, thereby requiring sophisticated metal-containing materials and dielectric materials in order to reduce the parasitic capacitance in the metallization layers and provide sufficiently high conductivity of the individual metal lines and vias. For example, in complex metallization systems, copper in combination with low-k dielectric materials, which are to be understood as dielectric materials having a dielectric constant of approximately 3.0 or less, are typically used in order to achieve the required electrical performance and the electromigration behavior as is required in view of reliability of the integrated circuits. Consequently, in lower lying metallization levels, metal lines and vias having critical dimensions of approximately 100 nm and significantly less may have to be provided in order to achieve the required "packing density" in accordance with density of circuit elements in the device level.

Upon further reducing the dimensions of the circuit elements, for instance using critical dimensions of 50 nm and less, the contact elements in the contact level have critical dimensions that are on that same order of magnitude. The contact elements typically represent plugs, which are formed of an appropriate metal or metal composition, wherein, in sophisticated semiconductor devices, tungsten, in combination with appropriate barrier materials, has proven to be a viable contact metal. When forming tungsten-based contact elements, typically the interlayer dielectric material is formed first and is patterned so as to receive contact openings, which extend through the interlayer dielectric material to the corresponding contact areas of the circuit elements. In particular, in densely packed device regions, the lateral size of the drain and source areas and thus the available area for the contact regions may be 100 nm and significantly less, thereby requiring extremely complex lithography and etch techniques in order to form the contact openings with well-defined lateral dimensions and with a high degree of alignment accuracy. In some cases, despite a manufacturer's best efforts, there are errors in forming the contact openings in the proper location. When the conductive contacts are formed in these misaligned openings, the performance of the resulting device may be degraded, if not destroyed.

FIG. 1A depicts an illustrative device 100 at the point of fabrication wherein various gate electrode structures 12 have been formed above a semiconductor substrate 10. Each of the illustrative gate electrode structures 12 includes an illustrative gate insulation layer 12A and a sacrificial gate electrode 12B. Also depicted in FIG. 1A are a gate cap layer 14 formed above the sacrificial gate electrode 12B, sidewall spacers 16 positioned proximate the gate electrode 12B, and a liner layer 18. The various structures depicted in FIG. 1A are positioned in a layer of insulating material 20. Also depicted in FIG. 1A are a plurality of metal silicide regions 22 formed in the substrate 10 and a layer of conductive material 24 formed above the device 100 and the metal silicide regions 22. It should be noted that the layer of conductive material 24 is formed above the gate electrode structures 12 at a time when the upper surface 12S of the gate electrode 12B is protected by the gate cap layer 14 and the liner layer 16, which are both typically made of silicon nitride.

Next, using prior art techniques, as shown in FIG. 1B, a CMP (chemical mechanical planarization) process is performed to essentially planarize the various materials positioned above the gate electrode 12B to thereby result in the definition of self-aligned contacts 24C. Unfortunately, in the real world, the planarization process may not result in the nice even planar surface depicted in FIG. 1B. This occurs for a variety of reasons, not the least of which is the fact that this CMP process must typically remove three different types of material, e.g., the layer of conductive material 24, the layer of insulating material 20, the liner layer 16 and the gate layer 14, the latter two being typically comprised of silicon nitride. It is very difficult to perform a CMP process that consistently and reliably planarizes three different types of material layers, e.g., silicon nitride, tungsten and silicon dioxide. Without a substantially uniform and planar surface, additional device fabrication becomes more difficult, especially in areas of photolithography. This is particularly true in modern semiconductor devices as various features now approach the limit of what photolithography tools can directly pattern. Thus, it is vitally important that, to the extent possible, all efforts are made to produce devices that, during intermediate stages of fabrication, do not produce surfaces with excessive topography changes.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is generally directed to methods of forming self-aligned contacts on a semiconductor device. In one example, the method includes forming a plurality of spaced-apart sacrificial gate electrodes above a semiconducting substrate, wherein each of the sacrificial gate electrodes has a gate cap layer positioned above the sacrificial gate electrodes, and performing at least one etching process to define a self-aligned contact opening between the plurality of spaced-apart sacrificial gate electrodes. The method further includes removing the gate cap layers to thereby expose an upper surface of each of the sacrificial gate electrodes, depositing at least one layer of conductive material in said self-aligned contact opening and removing portions of the at least one conductive material that are positioned outside of the self-aligned contact opening to thereby define at least a portion of a self-aligned contact positioned in the self-aligned contact opening.

In another illustrative example, the method includes forming a plurality of spaced-apart sacrificial gate electrodes above a semiconducting substrate, wherein each of the sacrificial gate electrodes comprises a gate cap layer positioned on the sacrificial gate electrode, performing at least one etching process to define a self-aligned contact opening between the plurality of spaced-apart sacrificial gate electrodes and forming a sacrificial material layer in the contact openings and above the sacrificial gate electrodes. The method further includes performing at least one planarization process to remove the gate cap layers to thereby expose an upper surface of each of the sacrificial gate electrodes and to remove portions of the sacrificial material layer positioned outside of the contact opening to thereby define a sacrificial material plug positioned in the contact opening, removing the sacrificial material plug, depositing at least one layer of conductive material in the self-aligned contact opening, and removing portions of the at least one conductive material that are positioned outside of the self-aligned contact opening to thereby define at least a portion of a self-aligned contact positioned in the self-aligned contact opening.

BRIEF DESCRIPTION OF THE DRAWINGS

The disclosure may be understood by reference to the following description taken in conjunction with the accompanying drawings, in which like reference numerals identify like elements, and in which:

FIGS. 1A-1B depict an illustrative prior art technique for forming self-aligned contacts for devices when employing replacement gate manufacturing techniques.

Figure 2A:
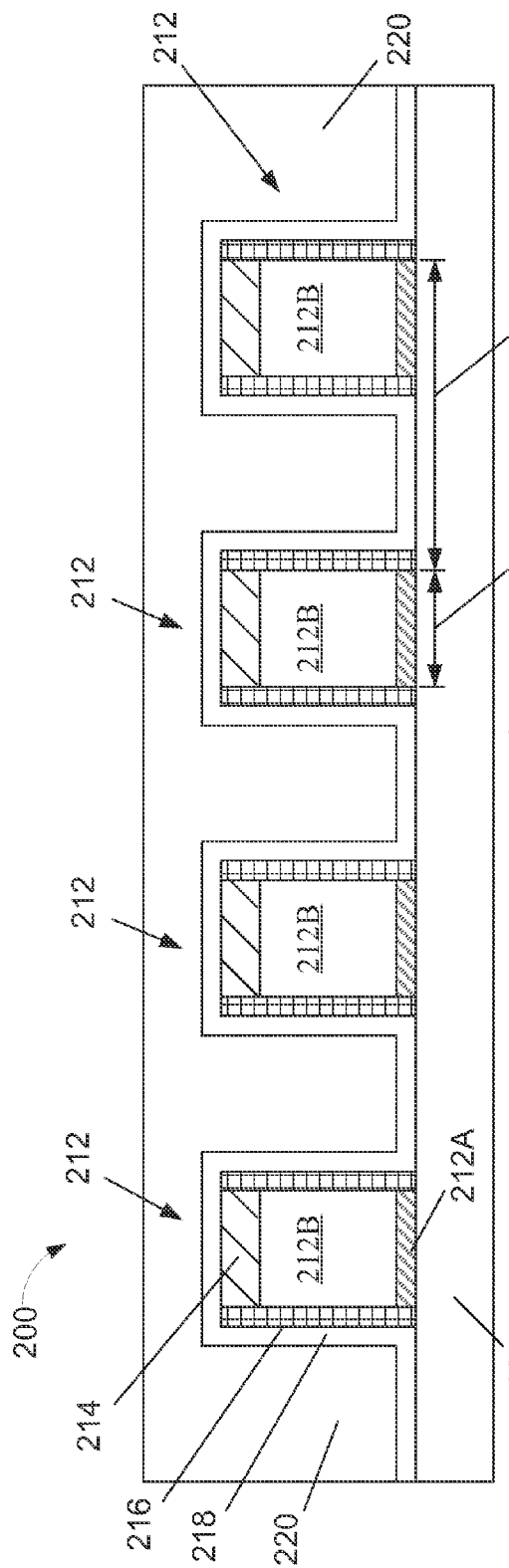
FIGS. 2A-2O depict one illustrative process flow disclosed herein for various methods of forming self-aligned contacts on a semiconductor device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to methods of forming self-aligned contacts on a semiconductor device manufactured using replacement gate techniques. In some cases, the devices may include a high-k dielectric material (k value greater than 10) and a metal-containing electrode material. As will be readily apparent to those skilled in the art upon a complete reading of the present application, the present method is applicable to a variety of technologies, e.g., NMOS, PMOS, CMOS, etc., and is readily applicable to a variety of devices, including, but not limited to, logic devices, memory devices, resistors, conductive lines, etc. With reference to FIGS. 2A-2O, various illustrative embodiments of the methods disclosed herein will now be described in more detail.

FIG. 2A is a simplified view of an illustrative semiconductor device 200 at an early stage of manufacturing that is formed above a semiconducting substrate 10. The substrate 10 may have a variety of configurations, such the depicted bulk silicon configuration. The substrate 10 may also have a silicon-on-insulator (SOI) configuration that includes a bulk silicon layer, a buried insulation layer and an active layer, wherein semiconductor devices are formed in and above the active layer. Thus, the terms substrate or semiconductor substrate should be understood to cover all semiconductor structures. The substrate 10 may also be made of materials other than silicon.

The device 200 is generally comprised of illustrative gate electrode structures 212 that are formed above the substrate 10. In one illustrative embodiment, each of the illustrative gate electrode structures 212 includes an illustrative gate insulation layer 212A and a sacrificial gate electrode 212B. Also depicted in FIG. 2A are a gate cap layer 214 formed above the sacrificial gate electrode 212B, sidewall spacers 216 positioned proximate the sacrificial gate electrode 212B, and a liner layer 218. The various structures depicted in FIG. 2A are positioned in a layer of insulating material 220. Of course, those skilled in the art will recognize that many features of an actual semiconductor device are not depicted in the attached figures so as not to obscure the present inventions. For example, one or more isolation structures (not shown) may be formed in the substrate 10 between the gate electrode structures 212, or between groups of the gate electrode structures 212, so as to individually isolate each of the transistor devices (or groups) that will ultimately be formed on the device 200. As another example, prior to forming the sidewall spacers 216, multiple ion implant processes may be performed to form so-called halo implant regions and extension implant regions in the substrate 10, but such implant regions are not depicted so as not to obscure the present inventions. As yet another example, in the case where one or more PMOS transistors are being manufactured, recesses may be formed in the substrate 10 proximate the gate electrode structure 212 of such a PMOS transistor only, and an epitaxially grown silicon-germanium material may be formed in those recesses. The epitaxial silicon-germanium material may help to impart a desirable compressive stress in the channel region of the PMOS transistor. Such silicon-germanium materials are not depicted in the drawings for purposes of clarity.

The illustrative gate insulation layer 212A may be made of, for example, silicon dioxide, and the illustrative sacrificial gate electrode 212B may be made of, for example, polysilicon or any other material that will serve the placeholder function of the sacrificial gate electrode 212B. Moreover, the gate insulation layer 212A may be the final gate insulation layer for the various transistor devices, or, as described more fully below, when the sacrificial gate electrode 212B is ultimately removed, the gate insulation layer 212A may also be removed and replaced with one or more additional layers of gate insulation material, which may include a high-k dielectric layer. As will be recognized by those skilled in the art after a complete reading of the present application, the gate electrode structure 212 of the device 200, i.e., the gate insulation layer 212A and the sacrificial gate electrode 212B, may be comprised of a variety of different materials and may have a variety of configurations.

The configuration and composition of the various structures depicted in FIG. 2A may also vary depending upon the application, and they may be manufactured using techniques well known to those skilled in the art. For example, the gate insulation layer 212A may be a layer of silicon dioxide and/or a layer of a high-k material (k value greater than 10), and it may be formed by performing a thermal growth process or by performing a deposition process. In one illustrative embodiment, the sacrificial gate electrode 212B may be comprised of polysilicon. In one illustrative embodiment, the gate electrode structures 212 may be relatively closely-spaced, e.g., they may have a gate pitch 211 of approximately 78-90 nm, and they may have a gate length 213 of approximately 30 nm. In one illustrative embodiment, the gate cap layer 214, the sidewall spacer 216 and the liner layer 218 may all be made of silicon nitride. In one illustrative embodiment, the gate cap layer 214 may have a thickness of approximately 40 nm, the sidewall spacers 216 may have a thickness of approximately 8 nm, and the liner layer 218 may have a thickness of approximately 7 nm. The layer of insulating material 220 may be made from a variety of different materials, e.g., a flowable material such as a spin-on glass, a flowable oxide, etc., and it may have a thickness of approximately 400-600 nm. In some cases, the layer of insulating material 220 may be subject to an anneal process after it is deposited on the device 200.

In a typical process flow, the isolation structures (not shown) are initially formed in the substrate 10. Thereafter, the gate insulation layer 212A is formed above the active areas of the substrate 10, e.g., a layer of silicon dioxide may be thermally grown on the substrate 10. Then, a layer of gate electrode material, e.g., polysilicon, may be blanket-deposited across the substrate 10, followed by the blanket-deposition of the material of the gate cap layer 214, such as silicon nitride, on the layer of gate electrode material. Thereafter, a patterned masking layer (not shown), e.g., a photoresist material, is formed above the layer of the gate cap material. Next, one or more etching processes are performed on the gate cap material layer and on the layer of gate electrode material to define the gate cap layer 214 and the gate electrode 212B depicted in FIG. 2A. Then, the illustrative sidewall spacers 216 may be made by blanket-depositing a layer of spacer material, e.g., silicon nitride, above the substrate 10 and performing an anisotropic etching process. In some embodiments, there may be a liner layer or other spacers positioned between the spacer 216 and the gate electrode 212B. Thus, the shorthand reference to the spacers 216 as the "first" spacers does not mean that such spacers were literally the first ones formed when making the device 200. Additionally, when it is stated herein or in the claims that a sidewall spacer is formed "proximate" a structure or component, such as a gate electrode, such language will be understood to cover situations where such a spacer actually contacts the structure or component, as well as a situation where there are one or more intervening layers of material between the spacer and the structure or component. The liner layer 218 may be formed by performing a conformal chemical vapor deposition (CVD) process.

Figure 2B:
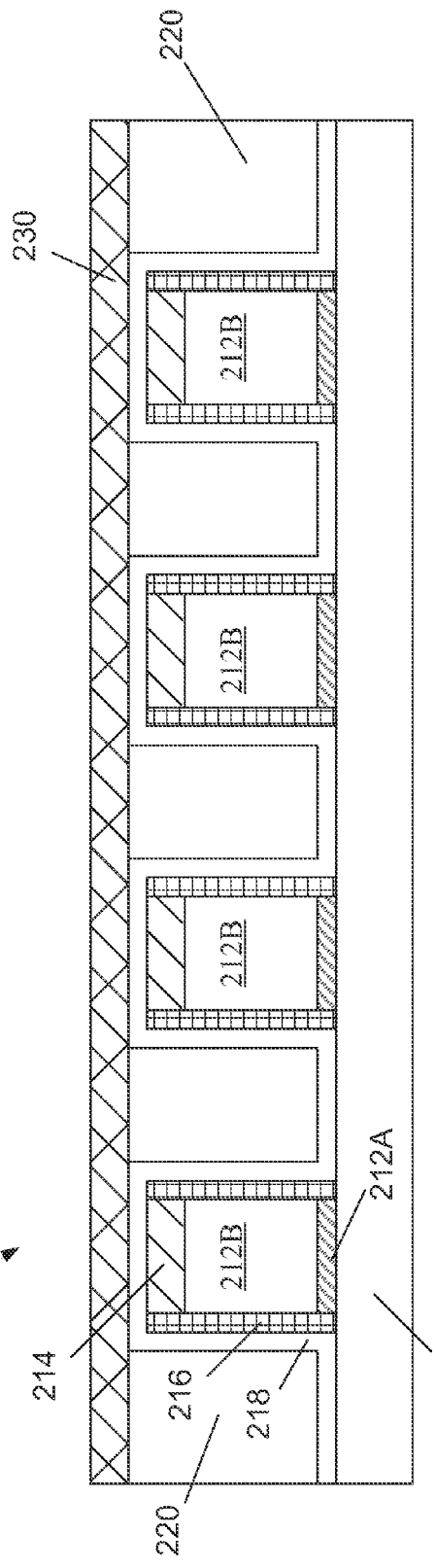

Next, as shown in FIG. 2B, a back-polish process, e.g., a CMP process, is performed on the layer of insulating material 220. This CMP process stops on the silicon nitride liner layer 218. There may be some loss of thickness of the liner layer 218, but it should be limited to approximately 5 nm or so. Then, in one illustrative embodiment, an illustrative sacrificial material layer 230 is formed above the device 200. In one illustrative embodiment, the sacrificial material layer 230 may be comprised of a siloxane-based material, one of the materials sold by Honeywell under the names DUO™ 248, DUO™ 193, and Accufill™ T-28, etc., and it may have a thickness ranging from approximately 10-100 nm. In general, in one embodiment, the sacrificial material layer 230 may be a material that is etchable (by RIE) like oxide, but is strippable (by a wet or a dry etch) selective to oxide. The illustrative sacrificial material layer 230 may be formed by a variety of techniques, such as by a spin-coating process. The sacrificial material layer 230 is typically not subjected to an anneal process as part of its formation process. The aforementioned DUO™ and Accufill™ materials tend to behave like a silicon dioxide with respect to reactive ion etching processes and CMP processes, but they can be wet etched selectively with respect to silicon dioxide and silicon nitride. Moreover, when the DUO™ and Accufill™ materials are oxidized to remove organic material, they can be stripped using a dilute HF acid bath (greater than 200:1) as compared to a layer of silicon dioxide made using TEOS. However, when the materials are not oxidized, they can be stripped using a solvent-based strip such as various alcohol based materials sold by EKC, e.g., EKC270, for stripping photoresist materials.

Then, as shown in FIG. 2C, a masking layer 225, with a mask opening 225A, is formed above the device 200. In one illustrative embodiment, the masking layer 225 comprises hard mask layer 226 and a cap layer 228. In one illustrative embodiment, the hard mask layer 226 may be a layer of amorphous carbon and the cap layer 228 may be a layer of silicon oxynitride or a silicon-containing anti-reflective coating layer. At the point depicted in FIG. 2C, the hard mask layer 226 and the cap layer 228 have been patterned using an immersion photolithography technique. A photoresist mask used during this process is not depicted in the drawings. An immersion photolithography technique may be employed due to the very small dimensions of modern semiconductor devices. As can be seen in FIG. 2C, the edge of the mask layer 225 is positioned above at least a portion of an underlying gate electrode structure 212.

Next, as shown in FIG. 2D, an etching process is performed to remove the cap layer 228 and to remove portions of the exposed sacrificial material layer 230. The amount of the sacrificial material layer 230 that is removed approximately corresponds to the thickness of the cap layer 228. That is, this portion of the etching process that is used in forming the self-aligned contacts described herein is not selective as between the cap layer 228 and the sacrificial material layer 230.

Figure 2E:
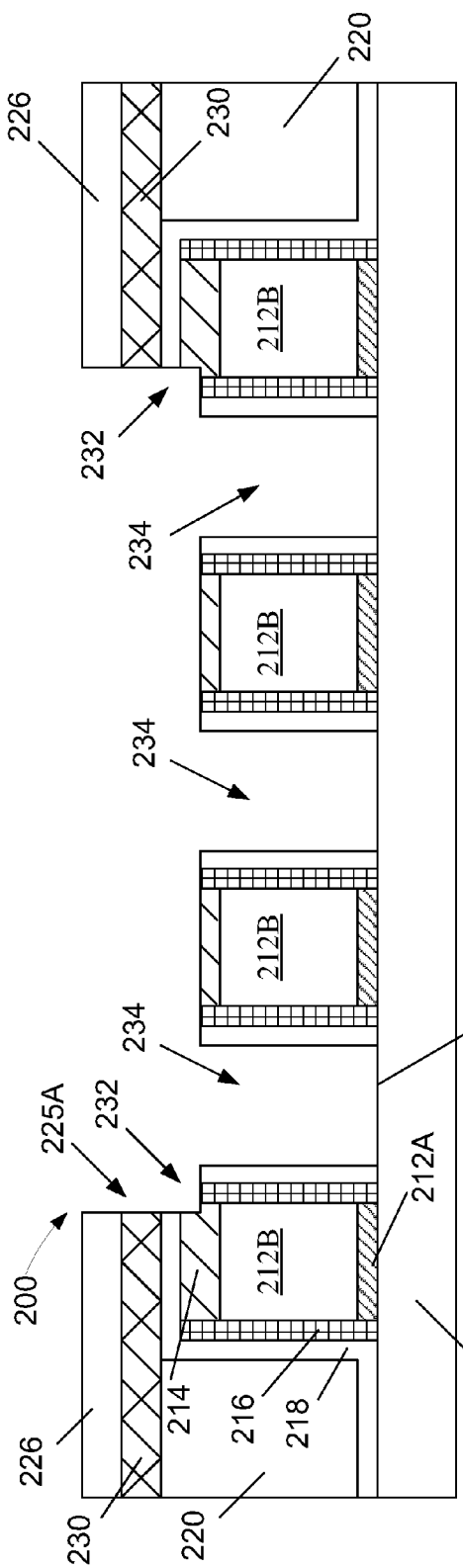

Next, as shown in FIGS. 2E (cross-sectional view) and 2F (plan view), one or more etching processes are performed to remove the remainder of the sacrificial material layer 230 and to remove portions of the first layer of insulating material 220 and the liner layer 218 positioned between the various gate electrode structures 212 to thereby expose the surface 10S of the substrate 10. During these etching processes, portions of the hard mask layer 226 may also be reduced in thickness. These etching processes result in the definition of a plurality of contact openings 234, each of which is positioned between the sacrificial gate electrodes 212B. Eventually, self-aligned contact structures will be formed in the contact openings 234. Of course, when it is stated that a contact opening 234 is formed "between" the adjacent sacrificial gate electrodes 212B, it will be understood that there may, and likely will, be other structures positioned between the contact opening 234 and the sacrificial gate electrodes 212B, and that actual contact between the sacrificial gate electrode 212B and the contact opening 234 is not required. For example, in the illustrative embodiment depicted in FIG. 2E, the contact opening 234 is positioned between the sacrificial gate electrodes 212B even though a portion of the liner layer 218 and the sidewall spacer 216 are also positioned between the contact opening 234 and the sacrificial gate electrodes 212B. It should further be noted that, during one or more of these etching processes, portions of the liner layer 216, the gate cap layer 214 and the spacers 216 are removed. This results in the situation where the outermost gate electrode structures depicted in FIG. 2E have areas 232 where portions of the various layers of silicon nitride material have been consumed. However, it should also be noted that the silicon nitride materials are of sufficient thickness such that these etching processes do not damage the overall integrity of the silicon nitride materials that encapsulate the gate electrode 212B.

As can be seen in FIG. 2F, the mask opening 225A is sized and configured so as to define the number, shape, location and configuration of the contact openings 234 and the self-aligned contacts that will eventually be formed in the contact openings 234. In the depicted example, the contact openings 234 have an illustrative rectangular configuration. However, the contact openings 234, and the resulting self-aligned contacts, may be of any desired shape or configuration.

Figure 2G:
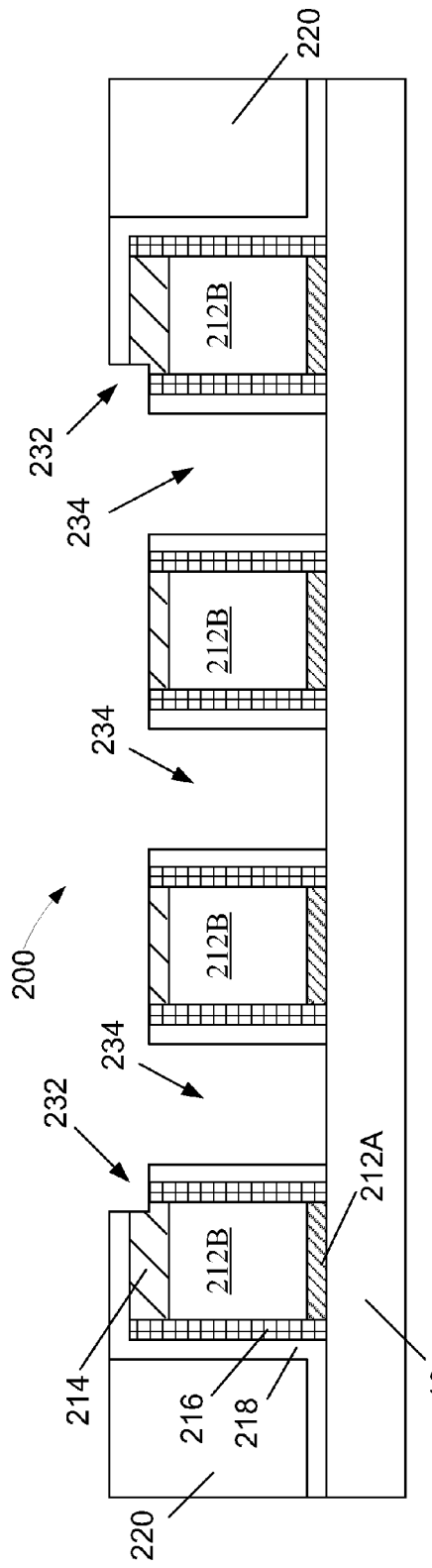

Then, as reflected in FIG. 2G, the hard mask layer 226 is removed by performing a wet or dry etching process. Thereafter, the sacrificial material layer 230 is removed selectively to the first layer of insulating material 220 by using a solvent type material that does not attack the underlying first layer of insulating material 220.

Figure 2H:
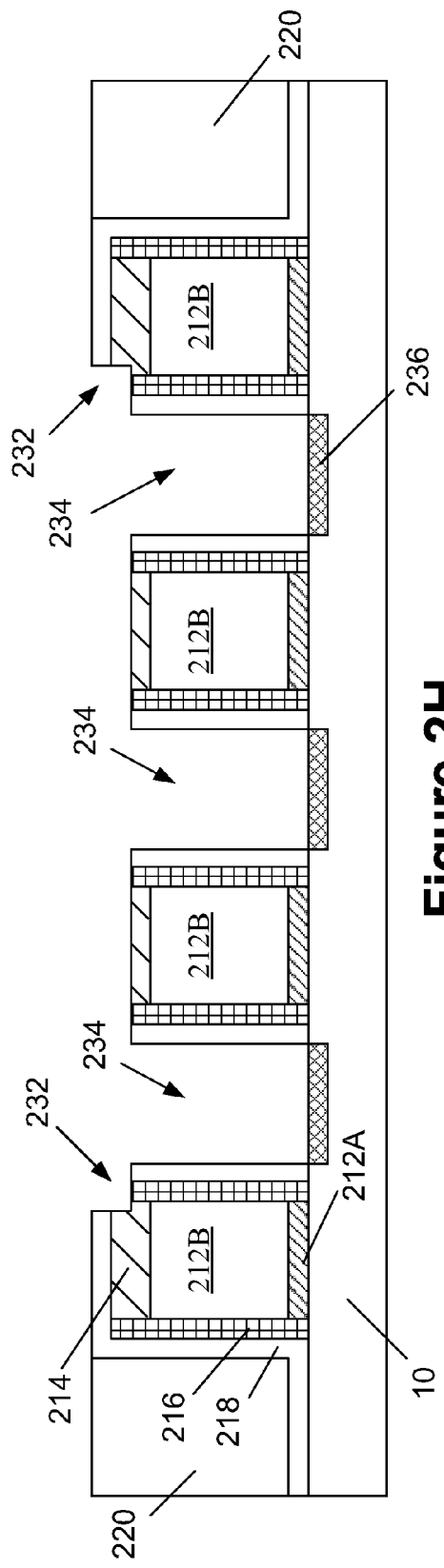

Next, as shown in FIG. 2H, metal silicide regions 236 are formed in the substrate 10 at the bottom of the contact openings 234 to facilitate contacting source/drain regions (not shown) that have been previously formed in the substrate 10. The metal silicide regions 236 may be formed using traditional silicide formation techniques. Prior to forming the metal silicide regions 236, the surface 10S of the substrate 10 may be cleaned using a chemical dry etching process. In a more specific example, the etching process may be a dry HF isotropic etching process as disclosed in U.S. Pat. No. 7,877,161 assigned to Tokyo Electron Limited, which is hereby incorporated by reference in its entirety. The metal silicide regions 236 may be formed from any type of refractory metal material, such as nickel, platinum, etc., or combinations thereof. In the illustrative example where the metal silicide regions 236 are made of a nickel silicide, these regions may be formed by depositing a layer of nickel, using a CVD process, performing an initial anneal step, stripping unreacted nickel material and thereafter performing a second anneal step. The particular materials of the metal silicide regions 236, and the manner in which they are formed, should not be considered a limitation of the present invention. It should be noted that the remaining gate cap layers 214 protect the sacrificial gate electrodes 212B during the silicide process used to form the metal silicide regions 236.

Figure 2I:
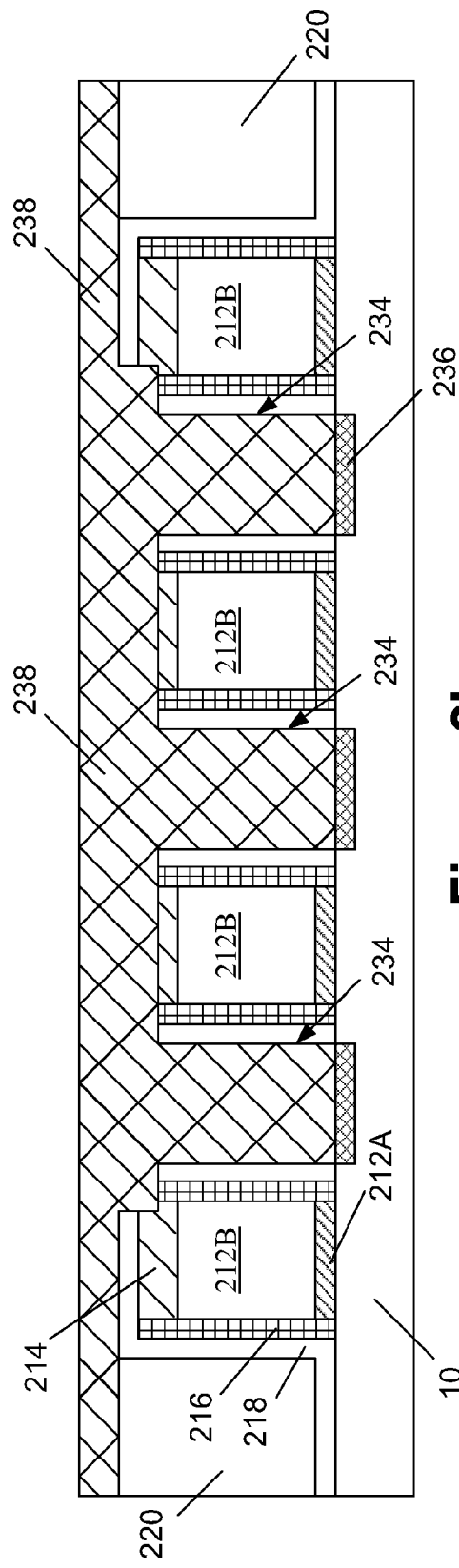

Next, as shown in FIG. 2I, another sacrificial material layer 238 is formed above the device 200. The sacrificial material layer 238 may be of the same material as previously described above with respect to the sacrificial material layer 230, or it may have a different material composition, such as a resist material. As will be described more fully below, in one particular example, the sacrificial material layer 238 is a material that is polishable with a selectivity to oxide and nitride of approximately 1:1:1. As depicted, the sacrificial material layer 238 overfills the contact openings 234 and extends above the first layer of insulating material 220.

Then, as shown in FIG. 2J, in one embodiment, a nonselective planarization process, e.g., a nonselective CMP process, is performed to remove the portions of the sacrificial material layer 238, the layer of insulating material 220 and the various nitride materials positioned above the upper surface 212S of the gate electrodes 212B. This CMP process is much easier to perform as compared to the prior art CMP process of polishing three different layers of material having different polishing characteristics, for example, tungsten, silicon nitride and silicon dioxide, because the sacrificial material layer 238 exhibits polishing characteristics that are similar to silicon dioxide. As a result, the CMP process depicted in FIG. 2J is more like polishing two different layers of material, like silicon dioxide and silicon nitride, which is a much easier polishing process to control while achieving the desired degree of planarity of the finished surface. The illustrative CMP process depicted in FIG. 2J exposes the upper surface 212S of the sacrificial gate electrode structures 212B, and results in the formation of sacrificial material plugs 238P in the contact openings 234. Exposing the upper surfaces 212S of the sacrificial gate electrode structures 212B may also be accomplished by performing a non-selective etching process, e.g., RIE, with endpoint detection of the exposed sacrificial gate electrode structures 212B that may be made of, for example, polysilicon.

Then, as shown in FIG. 2K, a wet removal process is performed to remove the sacrificial material plugs 238P (see FIG. 2J) selective to the other structures on the device 200. The next process in the formation of the device 200 involves the formation of self-aligned conductive contacts that will be electrically coupled to the metal silicide regions 236. These conductive contacts may be formed by performing known techniques. For example, when the conductive contacts are comprised of tungsten, one or more barrier layers, such as titanium/titanium nitride, may be deposited above the device 200 and into the contact openings 234. Thereafter, a layer of conductive material 240, such as tungsten, may be blanket-deposited above the device 200. For purposes of clarity, any barrier layers associated with forming the self-aligned conductive contacts are not depicted in the drawings. Thereafter, as indicated in FIG. 2L, a planarization process is performed to remove excess amounts of the layer of conductive material 240, thereby resulting in the definition of self-aligned contacts 240C (SAC).

Then, as shown in FIG. 2M, the next process involves removing the sacrificial gate electrodes 212B to define a plurality of gate openings 250. The sacrificial gate electrodes 212B may be removed by performing a variety of known etching processes. Additionally, at this time, if desired, the gate insulation layer 212A may also be removed and replaced by one or more additional gate insulation layers. Alternatively, the gate insulation layer 212A may remain in place. In the attached drawings, the gate insulation layer 212A is depicted as remaining in place. However, as will be recognized by those skilled in the art after a complete reading of the present application, the replacement gate structure, perhaps including one or more additional insulation layers, that will be positioned in the gate recesses 250 may be of any construction and comprised of any of a variety of different materials. For example, one or more metals, aluminum, titanium, tantalum, lanthanum, any type of work-function adjusting material, etc., may be formed in the gate recess 250 in addition to one or more layers of a high-k dielectric material. Thus, the particular details of construction of replacement gate electrode structures should not be considered a limitation of the present invention.

FIG. 2N depicts the device 200 at a later stage of manufacture. As shown therein, an illustrative layer of conductive material, e.g., aluminum, may be blanket-deposited above the device 200. The layer of conductive material 258 overfills the gate openings 250. Then, as shown in FIG. 2O, a planarization process is performed to remove excess portions of the layer of conductive material 258. This planarization process results in the definition of a plurality of replacement gate structures 260 (RG). As noted above, it should be understood that the replacement gate structure 260 depicted in the drawings is intended to be schematic and generic in nature, as the replacement gate structure 260 may be comprised of one or more conductive layers of material and one or more layers of insulating material, depending upon the desired performance of the device 200 under construction. Also depicted in FIG. 2O is a protective layer 262 comprised of, for example, silicon nitride, that is formed to protect the underlying structures from future processing operations performed on the device 200.

From this point forward, additional processing operations may be performed on the device 200, such as the formation of additional metallization layers (not shown) above the device 200 using known techniques. The conductive structures in these additional metallization layers may also be comprised of a variety of materials, such as, for example, copper. Of course, the total number of metallization layers may vary depending on the particular device under construction.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a plurality of spaced-apart sacrificial gate electrodes above a semiconducting substrate, each of said gate electrodes comprising a gate cap layer positioned above said sacrificial gate electrode;
    performing at least one etching process to define a self-aligned contact opening between said plurality of spaced-apart sacrificial gate electrodes;
    removing said gate cap layers to thereby expose an upper surface of each of said sacrificial gate electrodes;
    after removing said gate cap layers, and while said upper surface of each of said sacrificial gate electrodes is exposed, depositing at least one layer of conductive material on said exposed upper surfaces of said sacrificial gate electrode structures and in said self-aligned contact opening; and
    removing portions of said at least one layer of conductive material that are positioned outside of said self-aligned contact opening and above said upper surface of each of said sacrificial gate electrodes to thereby define at least a portion of a self-aligned contact positioned in said self-aligned contact opening.

2. The method of claim 1, further comprising, prior to performing said at least one etching process to define said self-aligned contact opening, forming a sidewall spacer proximate each of said sacrificial gate electrodes and forming a liner layer proximate said sidewall spacer.

3. The method of claim 1, further comprising:
    removing said sacrificial gate electrodes to thereby define a plurality of gate openings; and forming a replacement gate electrode in each of said gate openings.

4. The method of claim 1, wherein forming said replacement gate electrode comprises forming said replacement gate electrode comprised of a metal in each of said gate openings.

5. The method of claim 3, further comprising, after removing said sacrificial gate electrodes, but prior to forming said replacement gate electrode in each of said gate openings, removing a previously formed gate insulation layer that was positioned under each of said sacrificial gate electrodes, and forming at least one new gate insulation layer on said substrate.

6. The method of claim 1, wherein removing said gate cap layers to thereby expose said upper surface of each of said sacrificial gate electrodes comprises performing at least one chemical mechanical polishing process to remove said gate cap layers and thereby expose said upper surface of each of said sacrificial gate electrodes.

7. The method of claim 1, wherein removing said gate cap layers to thereby expose said upper surface of each of said sacrificial gate electrodes comprises performing at least one etching process to remove said gate cap layers and thereby expose said upper surface of each of said sacrificial gate electrodes.

8. The method of claim 1, wherein depositing said at least one layer of conductive material on said exposed upper surfaces of said sacrificial gate electrode structures and in said self-aligned contact opening comprises depositing at least one barrier metal layer and least one layer of conductive material above said barrier metal layer wherein said at least one conductive material over fills said self-aligned contact opening.

9. The method of claim 1, wherein said self-aligned contact is comprised of tungsten.

10. The method of claim 3, wherein said replacement gate electrode is comprised of aluminum, titanium, tantalum or lanthanum.

11. The method of claim 1, wherein, prior to removing said gate cap layers to expose an upper surface of each of said sacrificial gate electrodes, forming a metal silicide region in said substrate in an area of said substrate that was exposed by said self-aligned contact opening.

12. A method, comprising:
forming a plurality of spaced-apart sacrificial gate electrodes above a semiconducting substrate, each of said sacrificial gate electrodes comprising a gate cap layer positioned on said gate electrode;
performing at least one etching process to define a self-aligned contact opening between said plurality of spaced-apart sacrificial gate electrodes;
forming a sacrificial material layer in said contact opening and above said sacrificial gate electrodes;
removing said gate cap layers to thereby expose an upper surface of each of said sacrificial gate electrodes and to remove portions of said sacrificial material layer positioned outside of said contact opening to thereby define a sacrificial material plug positioned in said contact opening;
removing said sacrificial material plug;
after removing said sacrificial material plug, and while said upper surface of each of said sacrificial gate electrodes is exposed, depositing at least one layer of conductive material on said exposed upper surfaces of said sacrificial gate electrode structures and in said self-aligned contact opening; and
removing portions of said at least one conductive material that are positioned outside of said self-aligned contact opening and above said upper surface of each of said sacrificial gate electrodes to thereby define at least a portion of a self-aligned contact positioned in said self-aligned contact opening.

13. The method of claim 12, further comprising, after removing said sacrificial gate electrodes to thereby define a plurality of gate openings, forming a replacement gate electrode in each of said gate openings.

14. The method of claim 12, wherein, after removing said sacrificial gate electrodes, but prior to forming said replacement gate electrode in each of said gate openings, removing a previously formed gate insulation layer that was positioned under each of said sacrificial gate electrodes, and forming at least one new gate insulation layer on said substrate.

15. The method of claim 12, wherein removing said gate cap layers comprises performing at least one chemical mechanical polishing process.

16. The method of claim 12, wherein removing said gate cap layers comprises performing at least one etching process.

17. The method of claim 12, wherein said sacrificial material layer comprises at least one of a photoresist material, DUO™ 248, DUO™ 193, and Accufill™ T-28.

18. The method of claim 12, wherein said step of depositing said at least one layer of conductive material on said exposed upper surfaces of said sacrificial date electrode structures and in said self-aligned contact opening comprises depositing said at least one layer of conductive material on said exposed upper surfaces of said sacrificial gate electrode structures and in said self-aligned contact opening.

19. The method of claim 12, wherein, prior to forming said sacrificial material layer in said contact opening and above said sacrificial gate electrodes, forming a metal silicide region in said substrate in an area of said substrate that was exposed by said self-aligned contact opening.

* * * * *